United States Patent [19]
Masaie et al.

[11] Patent Number: 5,351,021
[45] Date of Patent: Sep. 27, 1994

[54] LADDER-TYPE PIEZOELECTRIC FILTER

[75] Inventors: Kimio Masaie; Minoru Sakamoto, both of Nagaokakyo, Japan

[73] Assignee: Murata Manufacturing Co., Ltd., Kyoto, Japan

[21] Appl. No.: 88,488

[22] Filed: Jul. 6, 1993

Related U.S. Application Data

[63] Continuation of Ser. No. 973,557, Nov. 9, 1992, abandoned, which is a continuation of Ser. No. 642,532, Jan. 17, 1991, abandoned.

[30] Foreign Application Priority Data

Feb. 8, 1990 [JP] Japan ..................... 2-29871

[51] Int. Cl.$^5$ ................................ H03H 9/58
[52] U.S. Cl. ..................... 333/189; 310/357
[58] Field of Search ................ 333/187–192; 310/320, 357, 359

[56] References Cited

U.S. PATENT DOCUMENTS 4,837,533 6/1989 Oshikawa ................. 333/189

FOREIGN PATENT DOCUMENTS 212212 9/1988 Japan ................. 333/191
302114 12/1990 Japan ................. 333/190
191008 11/1967 U.S.S.R. ............. 333/189

*Primary Examiner*—Benny Lee
*Attorney, Agent, or Firm*—Heller, Ehrman, White & McAuliffe

[57] ABSTRACT

In a ladder-type piezoelectric filter having a series arm constituted by a plurality of series resonators connected in series and parallel arms respectively constituted by parallel resonators, each of the resonators being constructed using a piezoelectric plate, the direction of polarization of the piezoelectric plate of the series resonator arranged in at least one end of the series arm and the direction of polarization of the piezoelectric plate of the parallel resonator connected to the series resonator arranged in at least one end of the series arm are the same as seen from the side of a node of the series resonator arranged in the end and the parallel resonator connected to the series resonator.

15 Claims, 1 Drawing Sheet

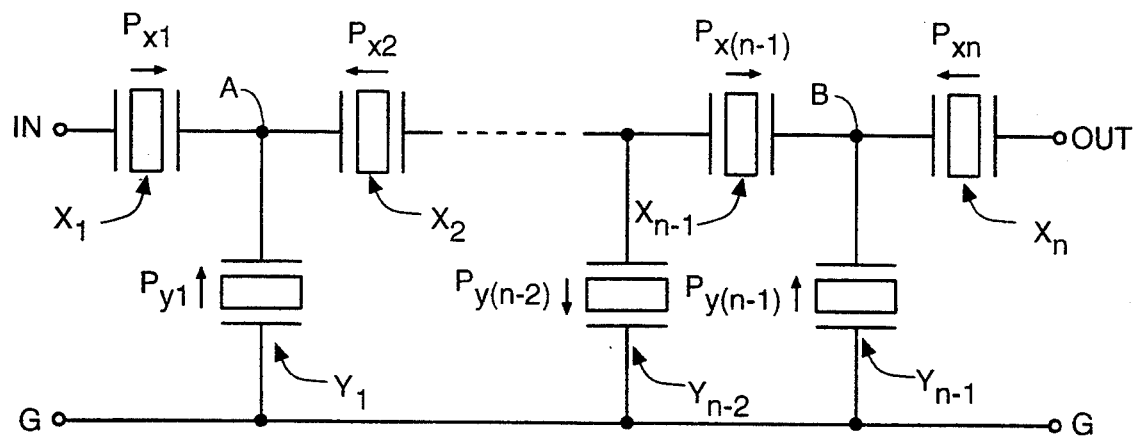
FIG._1
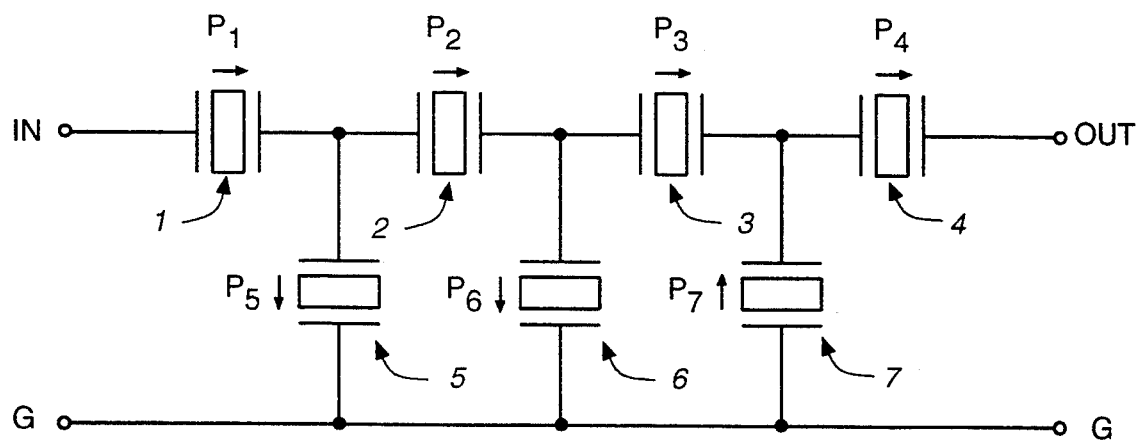
FIG._2 (PRIOR ART)
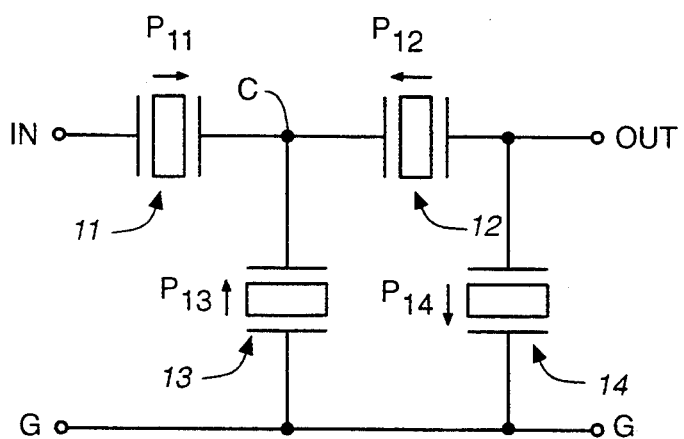
FIG._3

LADDER-TYPE PIEZOELECTRIC FILTER

This is a continuation of U.S. patent application Ser. No. 07/973,557 filed Nov. 9, 1992, now abandoned, which is a continuation of U.S. patent application Ser. No. 07/642,532 filed Jan. 17, 1991, now abandoned.

BACKGROUND OF THE INVENTION

1. Field of the Invention

The present invention relates generally to an improvement of a ladder-type piezoelectric filter constructed using a plurality of series resonators and parallel resonators, and more particularly, to a ladder-type piezoelectric filter in which the directions of polarization of resonators respectively constructed using piezoelectric plates are devised.

2. Description of the Prior Art

FIG. 2 shows one example of the known ladder-type piezoelectric filter. In this ladder-type filter, four series resonators 1 to 4 are connected in series between input and output terminals (IN and OUT) to thereby constitute a series arm. On the other hand, parallel resonators 5 to 7 are respectively connected between nodes of the series resonators 1 to 4 and a reference potential (G) to thereby constitute three parallel arms.

As respective resonators constituting the series resonators 1 to 4 and the parallel resonators 5 to 7, a resonator has been generally used in which a piezoelectric plate, for example, a piezoelectric ceramic plate is subjected to polarization processing in the direction of thickness and electrodes are formed on both major surfaces of the piezoelectric plate. Although in a circuit configuration shown in FIG. 2, four series resonators 1 to 14 and three parallel resonators 5 to 7 are used, the number of resonators and the number of stages of the filter are suitably altered in accordance with objective filter characteristics.

Meanwhile, in the ladder-type filter, the directions of polarization of piezoelectric plates of the respective resonators constituting the series resonators 1 to 4 and the parallel resonators 5 to 7 have not been conventionally considered. Japanese Patent Laid-Open Gazette No. 212212/1988 only discloses a ladder-type filter of such construction that the directions of polarization of piezoelectric plates of series resonators are made constant.

As a result, a product is sometimes made in which the directions of polarization $P_1$ to $P_4$ of the piezoelectric plates of the series resonators 1 to 4 are the same, while the directions of polarization $P_5$ to $P_7$ of the parallel resonators 5 to 7 are not the same, as represented by arrows $P_1$ to $P_7$ in FIG. 2. If the temperature of the piezoelectric plates is changed due to the change of the ambient temperature, high voltages are induced due to the pyroelectric effect of the piezoelectric plates. Consequently, when the directions of polarization $P_1$ to $P_7$ of the respective resonators are as shown in FIG. 2, the high voltages induced due to the pyroelectric effect of the piezoelectric plates respectively used for the resonators 1 to 7 are liable to be synergistically applied between the input and output terminals and the reference potential.

As a result, when a rapid change in temperature is made in the ladder-type filter at the time of soldering or the like, the high voltages induced due to the pyroelectric effect are liable to adversely affect an active device connected to the input or output terminal. Particular if a withstand voltage of the active device connected is low, the active device may, in some cases, be destroyed.

SUMMARY OF THE INVENTION

Accordingly, an object of the present invention is to provide a ladder-type piezoelectric filter of such construction that the adverse effects to a device connected to an input or output terminal which are caused by the pyroelectric effect of piezoelectric plates can be effectively prevented.

In accordance with a wide aspect of the present invention, in a ladder-type piezoelectric filter having a series arm constituted by a plurality of series resonators and parallel arms respectively constituted by parallel resonators, each of the resonators being constructed using a piezoelectric plate, the ladder-type filter is of the following construction. More specifically, it is of such construction that the directions of polarization of the piezoelectric plates of the series resonator arranged in at least one end of the series arm and the parallel resonator connected to the series resonator are the same as seen from the side of a node of the series resonator arranged in at least one end of the above series arm and the parallel resonator connected to the series resonator.

According to the present invention, the direction of polarization of the piezoelectric plate of the series resonator in at least one end of the series arm, that is, on the side of the input terminal or the output terminal and the direction of polarization of the piezoelectric plate of the parallel resonator connected to the series resonator are set as described above. Accordingly, high voltages caused by the pyroelectric effect of both the piezoelectric plates are canceled at a node of the above series resonator and parallel resonator, thereby to effectively prevent the high voltages from being applied to the input terminal or the output terminal.

Furthermore, it is preferable that the directions of polarization of the respective piezoelectric plates of the plurality of series resonators are alternately opposite to each other along the series arm. In this case, the high voltages caused by the pyroelectric effect in the series resonators are canceled between the adjacent series resonators. Consequently, the high voltages caused by the pyroelectric effect are more effectively prevented from being synergistically applied to the input or output terminal.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a ladder-type filter according to one embodiment of the present invention;

FIG. 2 is a circuit diagram for explaining a conventional ladder-type filter; and FIG. 3 is a circuit diagram for explaining another example of a ladder-type filter to which the present invention is applied.

Throughout the figures, components which are substantially the same or function at least equivalently are indicated by the same symbols, such as IN, OUT and G.

DESCRIPTION OF THE PREFERRED EMBODIMENTS

FIG. 1 shows a ladder-type filter to which one embodiment of the present invention is applied. In this ladder-type filter, n series resonators $X_1$ to $X_n$ are connected in series between input and output terminals (IN and OUT) to constitute a series arm. On the other hand, parallel resonators $Y_1$ to $Y_{n-1}$ are respectively connected between the series resonators $X_1$ to $X_n$, to respectively constitute parallel arms.

A first advantage of the ladder-type filter according to the present embodiment is that the directions of polarization $P_{x1}$ and $P_{y1}$ of piezoelectric plates of the series resonator $X_1$ and the parallel resonator $Y_1$ and directions of polarization $P_{xn}$ and $P_{y(n-1)}$ of piezoelectric plates of the series resonator $X_n$ and the parallel resonator $Y_{n-1}$ are the same as seen from respective nodes A and B of the series resonators $X_1$ and $X_n$ arranged in both ends of the series arm and the parallel resonators $Y_1$ and $Y_{n-1}$ connected to the series resonators $X_1$ and $X_n$.

Additionally, a second advantage of the ladder-type filter according to the present embodiment is that the directions of polarization $P_{x1}, P_{x2}, \ldots, P_{xn}$ of the piezoelectric plates of the series resonators $X_1$ to $X_x$ are alternately opposite to each other along the series arm.

The function of the ladder-type filter according to the above described embodiment will be described.

Suppose that a rapid change in temperature is made in the ladder-type filter by soldering or the like. In this case, the directions of polarization $P_{x1}$ and $P_{y1}$ of the piezoelectric plates of the series resonator $X_1$ and the parallel resonator $Y_1$ are set as described above when giving attention to the node A. Accordingly, high voltages caused by the pyroelectric effect of the piezoelectric plates of the series resonator $X_1$ and the parallel resonator $Y_1$ are canceled because they are applied to the node A with they being reverse in polarity, thereby to effectively prevent the high voltages caused by the pyroelectric effect from being applied between the input terminal and the reference potential.

Also on the side of the output terminal, high voltages caused by the pyroelectric effect of the piezoelectric plates of the series resonator $X_n$ and the parallel resonator $Y_{n-1}$ are canceled in the same manner with respect to the node B, thereby to effectively prevent the high voltages caused by the pyroelectric effect from being applied to the output terminal.

Furthermore, in the ladder-type filter according to the present embodiment, the directions of polarization of the piezoelectric plates of the n series resonators $X_1$ to $X_n$ constituting the series arm are alternately opposite to each other along the series arm, as represented by arrows $P_{x1}, P_{x2}, \ldots, P_{xn}$ in FIG. 1. Consequently, high voltages caused by the pyroelectric effect of the piezoelectric plates of the series resonators $X_1$ to $X_n$ are canceled between the adjacent series resonators, thereby to make it possible to prevent the high voltages caused by the n series resonators $X_1$ to $X_n$ from being applied to the input or output terminal.

Accordingly, it is found that the adverse effects of an active device or the like connected to the input terminal or the output terminal to the other device can be effectively prevented.

Although in the embodiment shown in FIG. 1, the ladder-type filter is so constructed as to satisfy the conditions for the directions of polarization according to the present invention on the side of both the nodes A and B, it may be so constructed as to satisfy the conditions for the directions of polarization according to the present invention only on the side of either one of the nodes A and B. For example, the adverse effects to the device connected to at least the output terminal out of the input and output terminals can be prevented for the time being even if the directions of polarization are not set on the side of the node A unlike the embodiment shown in FIG. 1 simply by setting the directions of polarization of the piezoelectric plates of the series resonator $X_n$ and the parallel resonator $Y_{n-1}$ as described above.

Furthermore, the directions of polarization of the piezoelectric plates of the series resonators $X_1$ to $X_n$ need not be alternately opposite to each other along the series arm. More specifically, the present effect can be obtained simply by setting the conditions for the directions of polarization on the side of the node A or B as described above.

Additionally, the ladder-type filter to which the present invention is applied is not limited to one having n series resonators and (n-1) parallel resonators as shown in FIG. 1. For example, the present invention can be also applied to a ladder-type filter using an even number of resonators as a whole, as shown in FIG. 3.

In a ladder-type filter shown in FIG. 3, two series resonators 11 and 12 and two parallel resonators 13 and 14 are connected to each other by lines in a ladder formation, $P^{11}$-$P_{14}$ respectively indicating the direction of polarization of the resonators 11-14. Since the directions of polarization $P_{11}$ and $P_{13}$ of piezoelectric plates of the series resonator 11 and the parallel resonator 13 are the same as seen from a node C of the series resonator 11 and the parallel resonator 13, high voltages caused by the pyroelectric effect of the piezoelectric plates of the series resonator 11 and the parallel resonator 13 are effectively prevented from being applied to an input terminal.

Furthermore, since the directions of polarization of piezoelectric plates of the series resonators 11 and 12 are opposite to each other as represented by arrows in FIG. 3, high voltages caused by the pyroelectric effect of the piezoelectric plates of the series resonators 11 and 12 can be effectively canceled. Consequently, a voltage caused by the pyroelectric effect of a piezoelectric plate of the parallel resonator 14 is only applied to an output terminal, thereby to reduce the adverse effects to a device connected to the output terminal.

As described in the foregoing, it is found that the adverse effects to an active device or the like connected to the ladder-type filter can be effectively prevented by also applying the present invention to the ladder-type filter using an even number of resonators.

The procedure and results of an experiment are described next to illustrate the invention. A plurality of ladder-type filters were constructed, each by using seven resonators as shown in FIG. 1 with n=4, that is, as shown in FIG. 2, and the voltage was measured between the input terminal of each and the ground potential ten minutes after these filters were dipped into molten solder at 260° C. for three seconds and then pulled out therefrom. For each measurement, the input impedance was so set as to be equivalent to a parallel connection of a resistor of 1MΩ and a capacitor of 10 pH.

The results are shown in the following Table 1. For comparison, a plurality of conventional ladder-type filters are prepared in which the directions of polarization of seven resonators are made random, and a voltage between an input terminal and an earth potential is measured after making the change in temperature in the same manner. The results are also shown in Table 1. The unit of the voltage in Table 1 is V.

TABLE 1

| sample number | embodiment | conventional filter |
|---|---|---|
| 1 | 0 | −6 |
| 2 | 0 | −15 |
| 3 | 0 | −10 |
| 4 | 0 | −4 |
| 5 | 0 | −10 |
| 6 | 0 | −20 |
| 7 | 0 | −15 |
| 8 | 0 | −10 |
| 9 | 0 | −7 |
| 10 | 0 | −15 |
| 11 | 0 | −15 |
| 12 | 0 | −3 |
| 13 | 0 | −10 |
| 14 | 0 | +4 |
| 15 | 0 | −10 |
| 16 | 0 | +3 |
| 17 | 0 | −15 |
| 18 | 0 | −15 |

As can be seen from Table 1, high voltages caused by the pyroelectric effect are applied by substantially large magnitude between the input terminal and the earth potential and the magnitude greatly varies in the conventional ladder-type filter in which the directions of polarization of the resonators are made random, while the magnitude is "0" in the ladder-type filter according to the present embodiment.

Meanwhile, the present invention is not limited to a ladder-type filter using resonators having a structure in which electrodes are formed on both major surfaces of a piezoelectric ceramic plate. For example, the present invention can be also applied to a ladder-type filter using a piezoelectric plate composed of a piezoelectric body other than ceramics, for example, single crystal.

Furthermore, the directions of polarization may be opposite to the directions represented by the arrows in FIG. 1, provided that the conditions according to the present invention are satisfied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ladder-type piezoelectric filter comprising an input terminal, an output terminal and a plurality of resonators each having a positive plate, a negative plate and a piezoelectric plate which is sandwiched between said positive and negative plates and is polarized in a direction defined by said positive plate to said negative plate;

some of said resonators being series resonators connected in series between said input and output terminals, nodes being defined as junction points between mutually adjacent pairs of said series resonators; one or more others of said resonators being parallel resonators connected to respective ones of said nodes; said series resonators including two end resonators at both ends of said series, the piezoelectric plate of one of said end resonators and the piezoelectric plate of one of said parallel resonators connected thereto being polarized in a same direction relative to the node therebetween.

2. The ladder-type piezoelectric filter according to claim 1, wherein the directions of polarization of the piezoelectric plates of each mutually adjacent pair of said series resonators are opposite to each other.

3. The ladder-type piezoelectric filter according to claim 1, wherein said ladder-type filter has n series resonators and (n-1) parallel resonators, where n is an integer which is greater than 1.

4. The ladder-type piezoelectric filter according to claim 3, wherein the directions of polarization of the piezoelectric plates of each mutually adjacent pair of said series resonators are opposite to each other.

5. The ladder-type piezoelectric filter according to claim 1, wherein said ladder-type filter has equal numbers of series resonators and parallel resonators.

6. The ladder-type piezoelectric filter according to claim 5, wherein the directions of polarization of the piezoelectric plates of each mutually adjacent pair of said series resonators are opposite to each other.

7. The ladder-type piezoelectric filter according to claim 1, wherein said piezoelectric plate is composed of piezoelectric ceramics.

8. The ladder-type piezoelectric filter according to claim 1, wherein each of said parallel resonators is connected to a different one of said nodes.

9. The ladder-type piezoelectric filter according to claim 1, wherein the piezoelectric plate of the other of said end resonators and the piezoelectric plate of another of said parallel resonators connected thereto are also polarized in a same direction relative to the node therebetween.

10. The ladder-type piezoelectric filter according to claim 9, wherein the directions of polarization of the piezoelectric plates of each mutually adjacent pair of said series resonators are opposite to each other.

11. The ladder-type piezoelectric filter according to claim 9, wherein said ladder-type filter has n series resonators and (n-1) parallel resonators, where n is an integer which is greater than 1.

12. The ladder-type piezoelectric filter according to claim 11, wherein the directions of polarization of the piezoelectric plates of each mutually adjacent pair of said series resonators are opposite to each other.

13. The ladder-type piezoelectric filter according to claim 9, wherein said ladder-type filter has equal numbers of series resonators and parallel resonators.

14. The ladder-type piezoelectric filter according to claim 13, wherein the directions of polarization of the piezoelectric plates of each mutually adjacent pair of said series resonators are opposite to each other.

15. The ladder-type piezoelectric filter according to claim 9, wherein said piezoelectric plate comprises piezoelectric ceramics.

* * * * *